US006987402B2

(12) United States Patent
Lee et al.

(10) Patent No.: US 6,987,402 B2
(45) Date of Patent: Jan. 17, 2006

(54) REVERSIBLE LOGIC ELEMENTS OPERATING IN A SYNCHRONOUS MODE

(75) Inventors: Jia Lee, Koganei (JP); Peper Ferdinand, Koganei (JP); Susumu Adachi, Koganei (JP)

(73) Assignee: National Institute of Information and Communication Technology Incorporated Administrative Agency, Tokyo (JP)

( * ) Notice: Subject to any disclaimer, the term of this patent is extended or adjusted under 35 U.S.C. 154(b) by 0 days.

(21) Appl. No.: 10/812,419

(22) Filed: Mar. 30, 2004

(65) Prior Publication Data

US 2004/0246028 A1    Dec. 9, 2004

(30) Foreign Application Priority Data

Mar. 31, 2003   (JP)   .............................. 2003-096076

(51) Int. Cl.
   *H03K 19/20*   (2006.01)
(52) U.S. Cl. ........................ 326/104; 326/105; 326/136
(58) Field of Classification Search ........ 326/104–106, 326/112, 136
   See application file for complete search history.

(56) References Cited

U.S. PATENT DOCUMENTS 5,493,240 A * 2/1996 Frank ........................... 326/98

6,316,962 B1 * 11/2001 Kwon ........................ 326/113

OTHER PUBLICATIONS

D. Michael Miller, Spectral and Two-Place Decompostion Techniques in Reversible Logic, 2002 IEEE, II-493-II-496.*
Morita, "A Simple Universal Logic Element and Cellular Automata for Reversible Computing," Proceedings of the Third International Conference on Machines, Computations and Universality Lecture Notes in Computer Science 2055, pp. 102-113, Chsinau, Moldova, May 2001.

* cited by examiner

*Primary Examiner*—James H. Cho
(74) *Attorney, Agent, or Firm*—Westerman, Hattori, Daniels & Adrian, LLP

(57) ABSTRACT

A new reversible element with six lines (three input lines and three output lines) and two states are proposed. This element is computationally universal in the sense that a universal Turing machine can be constructed from it. Two reversible elements, each of which has two input lines, two output lines, and two states. These two elements are related to each other in the sense that their functionalities are each other's inverse, so, one of the elements can be obtained from the other by reversing the operations conducted by the other, and interpreting the other's input lines as output lines and the other's output lines as input lines. Together these two elements form a computationally universal set, i.e., a universal Turing machine can be constructed from them.

18 Claims, 11 Drawing Sheets

PRIOR ART

PRIOR ART

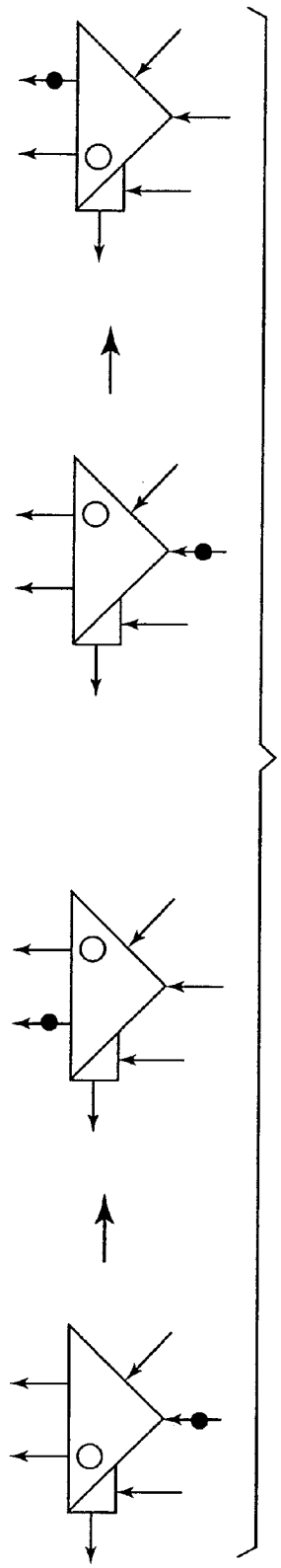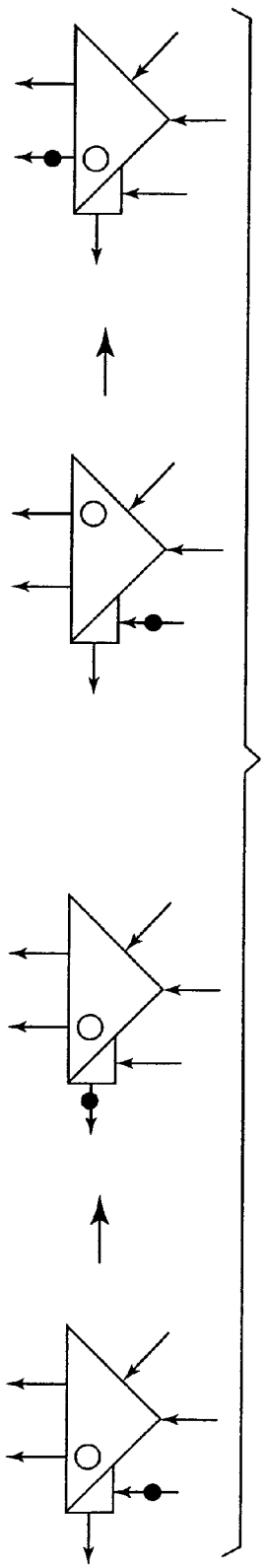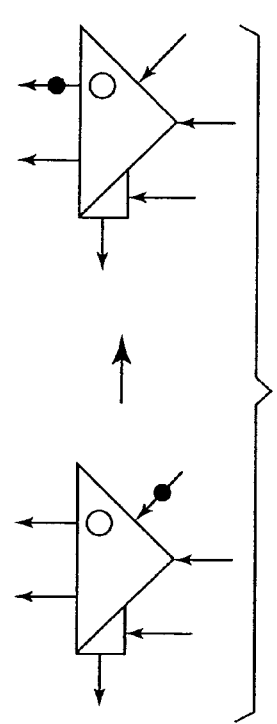

REVERSIBLE LOGIC ELEMENTS OPERATING IN A SYNCHRONOUS MODE

BACKGROUND OF THE INVENTION

1. Field of the Invention

The present invention relates to asynchronous reversible logic elements, a method for constructing asynchronous and reversible circuits using the elements and a method for constructing computers using the elements.

2. Description of Related Art

Microscopic physical phenomena are fundamentally reversible. To realize efficient and practical computers with ideally zero energy dissipation, reversible logic has been extensively studied but usually under the assumption that the underlying system is synchronous; i.e., all logic elements switch simultaneously in accordance with a central clock (Fredkin E and Toffoli T 1982 Conservative logic Int. J. Theoret. Phys. 21, 219–253). Because of the randomness of the operations that may occur within systems, a synchronous mode of timing seems hardly compatible with the backward determinism that accompanies reversible computing. Still, micro scale physical interactions are usually asynchronous. Asynchronous timing tends to reduce the energy dissipation per logic operation for different reasons: Logic elements in an asynchronous system can go into a sleeping state if they have no work to do; in synchronous system, idle logic elements have to engage in dummy switching whenever they receive clock signals (Hauck S 1995 Asynchronous design methodologies: an overview Proc. IEEE 83 (1) 69–93, Patra P 1995 Approaches to design of circuits for low-power computation Ph. D. Thesis University of Texas at Austin). The elements of an asynchronous system do not require a central clock signal and the hardware construction of a logic circuit may be simpler if an asynchronous mode of timing is adopted.

Universal reversible computer models that can conduct their computational tasks asynchronously have been proposed by Morita (Kenichi Morita, 'A Simple Universal Logic Element and Cellular Automata for Reversible Computing' MCU 2001, LNCS 2055, pp. 102–113, 2001), based on a reversible logic element called a Rotary Element (RE). Any reversible Turing machine (Turing machine is the prototype of modern electrical computers) can be constructed by using a network of REs, in which there is at most one particle moving around the entire circuit at any time. Since delays in any of the REs or lines do not affect the correctness of the computing process of the entire circuit, this circuit is called delay-insensitive (see e.g. Hauck S 1995 Asynchronous design methodologies: an overview Proc. IEEE 83 (1) 69–93, Patra P 1995 Approaches to design of circuits for low-power computation Ph. D. Thesis University of Texas at Austin). Thus, reversible computers consisting of REs can work in asynchronous mode, without needing a central clock signal to drive the operations of each RE (Kenichi Morita, 'A Simple Universal Logic Element and Cellular Automata for Reversible Computing' MCU 2001, LNCS 2055, pp. 102–113, 2001).

An RE has four input lines, four output lines, and two internal states. Although the RE can be used to realize reversible computers that operate asynchronously, it is somewhat complex, especially regarding the number or input and output lines. Intuitively, the less complex logic element is, the more opportunities it may offer for physical implementation. The purpose of this invention is thus to provide reversible elements that have less input and output lines than the conventional RE.

SUMMARY OF THE INVENTION

The object described above is achieved by the following inventions:

1. We introduce a new reversible element with six lines (three input lines and three output lines) and two states. This element is computationally universal in the sense that a universal Turing machine can be constructed from it.

2. We introduce two reversible elements, each of which has two input lines, two output lines, and two states. These two elements are related to each other in the sense that their functionalities are each other's inverse, so, one of the elements can be obtained from the other by reversing the operations conducted by the other, and interpreting the other's input lines as output lines and the other's output lines as input lines. Together these two elements form a computationally universal set, i.e., a universal Turing machine can be constructed from them.

A first embodiment of the present invention relates to a reversible logic element having three input lines {T, T', S} from which a signal can be input, three output lines {$T_A$, $T_B$, S'} to which the signal can be output by output means, two states (an A-state and a B-state) controllable by state control means, input information identification means for identifying which of the three input lines the signal is input from; state determination means for determining whether the reversible logic element is in the A-state or the B-state; and control means, wherein if said state determination means determines that said reversible logic element is in the A-state and the signal is input from the input line T, then said state determination means conveys information that said reversible logic element is in the A-state to said control means, said input information identification means conveys information that the signal is input from the input line T to said control means, and said control means controls said output means to output the signal to the output line $T_A$ and controls the state control means to change the state of the reversible logic element to the B-state, if said state determinations means determines that said reversible logic element is in the B-state and the signal is input from the input line T, then said state determination means conveys information that said reversible logic element is in the B-state to said control means, said input information identification means conveys the information that the signal is input from the input line T to said control means, and said control means controls said output means to output the signal to the output line $T_B$ and controls said state control means to change the state of the reversible logic element to the A-state, if said state determinations means determines that said reversible logic element is in the A-state and the signal is input from the input line S, then said state determination means conveys the information that said reversible logic element is in the A-state to said control means, said input information identification means conveys information that the signal is input from the input line S to said control means, and said control means controls said output means to output the signal to the output line S' while keeping said reversible logic element in the A-state, if said state determinations means determines that said reversible logic element is in the B-state and the signal is input from the input line S, then said state determination means conveys the information that said reversible logic element is in the B-state to said control means, said input information identification means conveys the information that the signal is input from the input line S to said control means, and said control means controls said output means to output the signal to the output line $T_A$ and controls said state control means to change the state of said reversible logic element to the A-state, and if said state determinations means determines that said reversible logic element is in the B-state and the signal is input from the input line T', then said state determination means conveys the information that said reversible logic element is in the B-state to said control means, said input information identification means conveys information that the signal is input from the input line T' to said control means, and said control means controls said output means to output the signal to the output line $T_B$ while keeping said reversible logic element in the B-state.

It is a preferred aspect of the reversible logic element according to the first embodiment, wherein said signal is an electric signal.

Another preferred aspect of the present invention is a method for constructing a logic circuit using the reversible logic element according to the first embodiment.

Another preferred aspect of the present invention is a method for constructing a computer using the reversible logic element according to the first embodiment.

Another preferred aspect of the present invention is a program for allowing a computer to function as the reversible logic element according to the first embodiment.

Another preferred aspect of the present invention is a recording medium recording the program above.

A second embodiment of the present invention relates to a reversible logic element having three input lines {T, T', S} from which a signal can be input, three output lines {$T_A$, $T_B$, S'} to which the signal can be output by output means, two states (an A-state and a B-state) controllable by state control means, the reversible logic element comprising:

input information identification means for identifying which of the three input lines the signal is input from;

state determination means capable of determining whether the reversible logic element is in the A-state or the B-state; and control means, wherein if said state determination means determines that said reversible logic element is in the A-state and the signal is input from the input line T, then said state determination means conveys information that said reversible logic element is in the A-state to the control means, said input information identification means conveys information that the signal is input from the input line T to said control means, and said control means controls said output means to output the signal to the output line $T_A$ and controls said state control means to change the state of the reversible logic element to the B-state, if said state determinations means determines that said reversible logic element is in the B-state and the signal is input from the input line T, then said state determination means conveys information that said reversible logic element is in the B-state to said control means, said input information identification means conveys the information that the signal is input from the input line T to said control means, and said control means controls the output means to output the signal to the output line $T_B$ and controls the state control means to change the state of the reversible logic element to the A-state, if said state determinations means determines that said reversible logic element is in the A-state and the signal is input from the input line S, then said state determination means conveys the information that said reversible logic element is in the A-state to said control means, said input information identification means conveys information that the signal is input from the input line S to said control means, and said control means controls the output means to output the signal to the output line S' while keeping said reversible logic element in the A-state, if said state determinations means determines that said reversible logic element is in the B-state and the signal is input from the input line S, then said state determination means conveys the information that said reversible logic element is in the B-state to said control means, said input information identification means conveys the information that the signal is input from the input line S to said control means, and said control means controls said output means to output the signal to the output line $T_A$ and controls said state control means to change the state of said reversible logic element to the A-state, if said state determinations means determines that said reversible logic element is in the A-state and the signal is input from the input line T', then said state determination means conveys the information that said reversible logic element is in the A-state to said control means, said input information identification means conveys information that the signal is input from the input line T' to said control means, and said control means controls said output means to output the signal to the output line S' and controls said state control means to change the state of said reversible logic element to the B-state; and if said state determinations means determines that said reversible logic element is in the B-state and the signal is input from the input line T', then said state determination means conveys the information that said reversible logic element is in the B-state to said control means, said input information identification means conveys information that the signal is input from the input line T' to said control means, and said control means controls said output means to output the signal to the output line $T_B$ while keeping said reversible logic element in the B-state.

A preferred aspect of the present invention is the reversible logic element according to the second embodiment, wherein said signal is an electric signal.

Another preferred aspect of the present invention is a method for constructing a logic circuit using the reversible logic element according to the second embodiment.

Another preferred aspect of the present invention is a method for constructing a computer using the reversible logic element according to the second embodiment.

Another preferred aspect of the present invention is a program for allowing a computer to function as the reversible logic element according to the second embodiment.

Another preferred aspect of the present invention is a recording medium recording the program above.

A third embodiment of the present invention relates to a reversible logic element group comprising: a first reversible logic element; and a second reversible logic element, wherein the first reversible logic element has two input lines {S, T} from which a signal can be input, two output lines {$T_A$, $T_B$} to which the signal can be output by output means, two states (an A-state and a B-state) controllable by state control means, the first reversible logic element comprising: input information identification means for identifying which of the two input lines the signal is input from; state determination means capable of determining whether the first reversible logic element is in the A-state or the B-state; and control means, and if said state determination means determines that said first reversible logic element is in the A-state and the signal is input from the input line T, then said state determination means conveys information that said first reversible logic element is in the A-state to said control means, said input information identification means conveys information that the signal is input from the input line T to said control means, and said control means controls the output means to output the signal to said output line $T_A$ and controls said state control means to change the state of said first reversible logic element to the B-state, if said state determinations means determines that said first reversible logic element is in the B-state and the signal is input from the input line T, then said state determination means conveys information that said first reversible logic element is in the B-state to said control means, said input information identification means conveys the information that the signal is input from the input line T to said control means, and said control means controls said output means to output the signal to the output line $T_B$ and controls said state control means to change the state of said first reversible logic element to the A-state, if said state determinations means determines that said first reversible logic element is in the A-state and the signal is input from the input line S, then said state determination means conveys the information that said first reversible logic element is in the A-state to said control means, said input information identification means conveys information that the signal is input from the input line S to said control means, and said control means controls said output means to output the signal to the output line $T_A$ and controls said state control means to keep the state of said first reversible element in the A-state, and if said state determinations means determines that said first reversible logic element is in the B-state and the signal is input from the input line S, then said state determination means conveys the information that said first reversible logic element is in the B-state to said control means, said input information identification means conveys the information that the signal is input from the input line S to said control means, and said control means controls said output means to output the signal to the output line $T_B$ and controls said state control means to keep said first reversible logic element in the B-state; and wherein a second reversible logic element has two input lines $\{T_A, T_B\}$ from which a signal can be input, two output lines $\{S, T\}$ to which the signal can be output by output means, two states (an A-state and a B-state) controllable by state control means, the second reversible logic element comprising: input information identification means for identifying which of the two input lines the signal is input from; state determination means capable of determining whether the second reversible logic element is in the A-state or the B-state; and control means, wherein if said state determination means determines that said second reversible logic element is in the B-state and the signal is input from the input line $T_A$, then said state determination means conveys information that said second reversible logic element is in the B-state to the control means, said input information identification means conveys information that the signal is input from the input line $T_A$ to said control means, and said control means controls said output means to output the signal to the output line T and controls said state control means to change the state of said second reversible logic element to the A-state, if said state determinations means determines that said second reversible logic element is in the A-state and the signal is input from the input line $T_B$, then said state determination means conveys information that said second reversible logic element is in the A-state to said control means, said input information identification means conveys information that the signal is input from the input line $T_B$ to said control means, and said control means controls said output means to output the signal to the output line T and controls said state control means to change the state of said second reversible logic element to the B-state, if said state determinations means determines that said second reversible logic element is in the A-state and the signal is input from the input line $T_A$, then said state determination means conveys the information that said second reversible logic element is in the A-state to said control means, said input information identification means conveys the information that the signal is input from the input line $T_A$ to said control means, and said control means controls the output means to output the signal to the output line S and controls said state control means to keep the state of said second reversible element in the A-state, and if said state determinations means determines that said second reversible logic element is in the B-state and the signal is input from the input line $T_B$, then said state determination means conveys the information that said second reversible logic element is in the B-state to said control means, said input information identification means conveys the information that the signal is input from the input line $T_B$ to said control means, and said control means controls said output means to output the signal to the output line S and controls said state control means to keep said second reversible logic element in the B-state.

A preferred aspect of the present invention is the reversible logic element group according to the third embodiment, wherein said signal is an electric signal.

Another preferred aspect of the present invention is a method for constructing a logic circuit using the reversible logic element group according to the third embodiment.

Another preferred aspect of the present invention is a method for constructing a computer using the reversible logic element group according to the third embodiment.

Another preferred aspect of the present invention is a program for allowing a computer to function as the first reversible logic element and the second reversible logic element according to the third embodiment.

Another preferred aspect of the present invention is a recording medium records the program above.

BRIEF DESCRIPTION OF THE DRAWINGS

FIG. 2 (b) shows an RE's operation on an input signal in the vertical case. The signal (particle) is denoted by a token on a line.

FIG. 3 (b) shows a six-line element in a B-state.

FIG. 4 (a) shows a six-line reversible element operating on input from input line T. FIG. 4 (b) shows a six-line reversible element operating on input from input line S. FIG. 4 (c) shows a six-line reversible element operating on input from input line T'.

FIG. 5 (b) shows the realization of the C-D module using six-line reversible elements.

FIG. 7 (b) shows an RT element in a B-state.

FIG. 8 (b) shows an IRT element in a B-state.

FIG. 9 (b) shows RTs operating on a signal arriving on input line S.

DETAILED DESCRIPTION OF THE INVENTION

A first embodiment of the present invention relates to a six-line reversible logic element having three input lines, three output lines, and two states. A second embodiment of the present invention relates to two types of four-line reversible logic elements having two input lines, two output lines, and two states. A pair of the four-line reversible logic elements has functionalities that are each other's inverse. One of the four-line elements can be obtained from the other by reversing the operations conducted by the other, and interpreting the other's input lines as output lines and the other's output lines as input lines.

The present invention demonstrates that the logic functionality of an RE can be realized by a circuit constructed only from the six-line reversible logic elements according to the first embodiment or by a circuit constructed only from the two four-line reversible logic elements according to the second embodiment. The result shows that an arbitrary reversible Turing machine (i.e., universal computer) can be constructed using the reversible logic elements of the present invention. The result also shows that a computer using the reversible logic elements of the present invention can conduct reversible computing in an asynchronously timed mode. Reversible computing in an asynchronously timed mode has the potential of requiring very low or even zero energy consumption.

RE

Figure 1A:
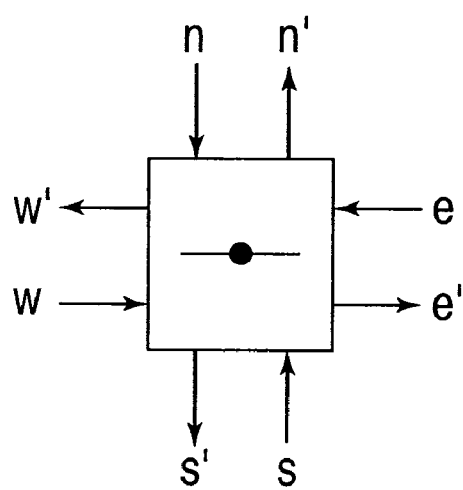
FIG. 1(a) shows an RE in the H-state.
Figure 1B:
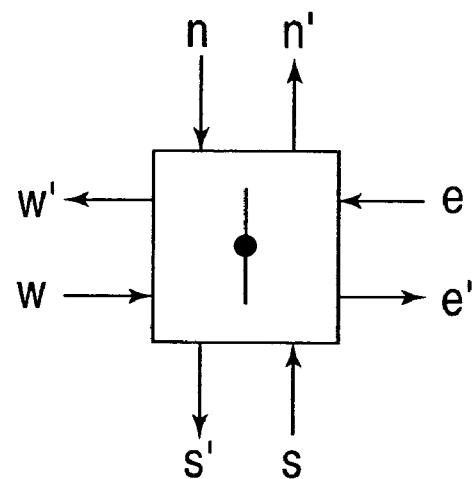
FIG. 1(b) shows an RE in the V-state.

As shown in FIGS. 1(a) and 1(b), an RE has four input lines {n, e, s, w}, four output lines {n', e', s', w'}, and two states, e.g., the H-state and the V-state. In this specification, the H-state and the V-state are displayed as horizontal and vertical bars in the RE respectively. Unlike in conventional logic systems, the signal used here is always one-valued. For this reason, it is also referred to in this specification as "a particle". A signal in the system is preferably an electronic signal. An RE does not alter its state if no signal arrives on any input lines.

Figure 2A:
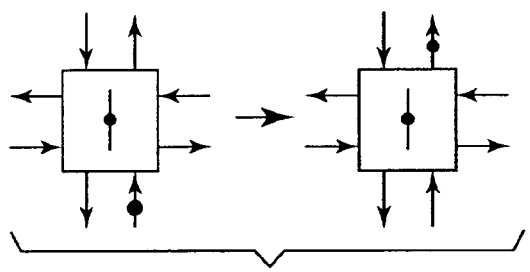
FIG. 2 (a) shows an RE's operation on an input signal in the parallel case.
Figure 2B:
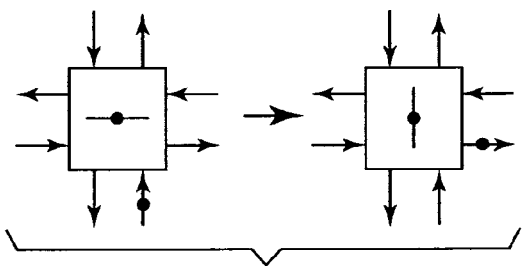

When a signal (particle) arrives on one of the input lines of an RE, the RE operates on the particle as follows: If the particle comes from a direction parallel to the rotating bar of an RE, it passes straight through to the opposite output line, without changing the direction of the bar (the state of the RE), as in FIG. 2(a); if the particle comes from a direction orthogonal to the rotating bar, it is deflected to the right, and the bar rotates by 90 degrees (FIG. 2(b)). Simultaneous particles on any pair of input lines are not allowed. Namely, the number of input signals (particles) that an RE can control is at most one at any time.

The functionality of an RE is reversible in the sense that, the input line from which a particle comes and the state of the RE before operation on the particle are uniquely determined by the output line to which the particle is transferred by the RE and the resultant state of the RE after the operation. The RE also has a conservative property, in the sense that the number or signals remains always the same before and after an operation. Furthermore, since an RE operates in asynchronous mode (the RE still can be used as a logic gate in synchronous circuits), its operation on an input signal can be done at arbitrary times, without the need to keep pace with a central signal.

Six-Line Reversible Element

We introduce a reversible logic element for a first embodiment of the present invention (hereinafter also called as "the first reversible element"). The first reversible element has three input lines {T, T', S}, three output lines {$T_A$, $T_B$, S'}, and two states, (an A-state and a B-state, see FIGS. 3(a) and 3(b), respectively).

A reversible logic element for the first embodiment of the present invention is realized by three input lines {T, T', S} from which a signal can be input, three output lines {$T_A$, $T_B$, S'} to which the signal can be output by output means, two states (an A-state and a B-state) controllable by state control means, the reversible logic element comprising: input information identification means for identifying which of the three input lines the signal is input from; state determination means capable of determining whether the reversible logic element is in the A-state or the B-state; and control means, wherein:

if the state determination means determines that the reversible logic element is in the A-state and the signal is input from the input line T, then the state determination means conveys information that the reversible logic element is in the A-state to the control means, the input information identification means conveys information that the signal is input from the input line T to the control means, and the control means controls the output means to output the signal to the output line $T_A$ and controls the state control means to change the state of the reversible logic element to the B-state, if the state determinations means determines that the reversible logic element is in the B-state and the signal is input from the input line T, then the state determination means conveys information that the reversible logic element is in the B-state to the control means, the input information identification means conveys the information that the signal is input from the input line T to the control means, and the control means controls the output means to output the signal to the output line $T_B$ and controls the state control means to change the state of the reversible logic element to the A-state, if the state determinations means determines that the reversible logic element is in the A-state and the signal is input from the input line S, then the state determination means conveys the information that the reversible logic element is in the A-state to the control means, the input information identification means conveys information that the signal is input from the input line S to the control means, and the control means controls the output means to output the signal to the output line S' while keeping the reversible logic element in the A-state, if the state determinations means determines that the reversible logic element is in the B-state and the signal is input from the input line S, then the state determination means conveys the information that the reversible logic element is in the B-state to the control means, the input information identification means conveys the information that the signal is input from the input line S to the control means, and the control means controls the output means to output the signal to the output line $T_A$ and controls the state control means to change the state of the reversible logic element to the A-state, and if the state determinations means determines that the reversible logic element is in the B-state and the signal is input from the input line T', then the state determination means conveys the information that the reversible logic element is in the B-state to the control means, the input information identification means conveys information that the signal is input from the input line T' to the control means, and the control means controls the output means to output the signal to the output line $T_B$ while keeping the reversible logic element in the B-state.

The control means selects, for example, table information to be selected based on the information conveyed from the state determination means, it refers to tables shown in Tables 1 and 2 below, and it transmits commands to the state control means and the output means, respectively, in accordance with the input line information conveyed from the input information identification means.

In the preferred embodiment, the reversible logic element of the present invention further comprises an input prohibition means. The input prohibition means is a means for prohibiting of entering the signal into the input line T' when the state determinations means determines that the reversible logic element is in the A-state.

Table 1 represents the relationship between the input line information and the commands transmitted from the control means to the state control means, and the output means respectively, while the reversible logic element is in the A-state.

TABLE 1

| Input line | output means | state control means |
| --- | --- | --- |
| T | $T_A$ | B |
| S | S' | A |

Table 2 represents the relationship between the input line information and the commands transmitted from the control means to the state control means, the output means, and the state control means, respectively, while the reversible logic element is in the B-state.

TABLE 2

| Input line | output means | state control means |
| --- | --- | --- |
| T | $T_B$ | A |
| S | $T_A$ | A |
| T' | $T_B$ | B |

A basic operation of the reversible logic element according to the first embodiment of the present invention will be described with reference to FIGS. 4A to 4C. In FIGS. 4A to 4C, the A-state and the B-state are defined so that a state in which a white circle is located in the left part of the first reversible logic element is the A-state and a state in which the white circle is located in the right part of the first reversible logic element is the B-state.

Figure 3A:
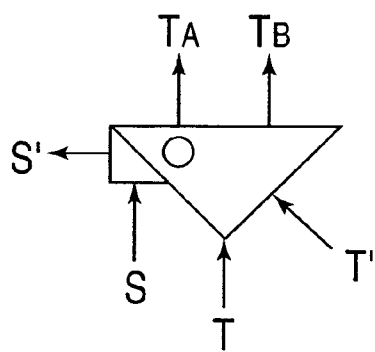
FIG. 3 (a) shows a six-line element in an A-state.
Figure 3B:
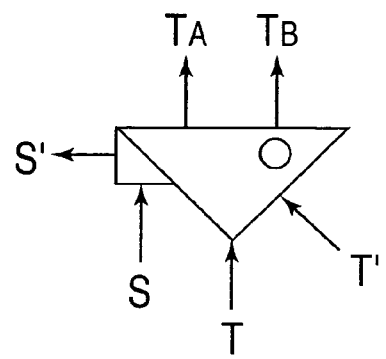

When a signal arrives on one of its input lines, this element operates on the signal in the following way: A signal arriving on input line T is transferred to output line $T_A(T_B)$ when the six-line reversible element is in state A(B), and changes the state to B(A). (FIG. 4(a)); A signal that arrives on input line S is transferred to output line S'($T_A$), and always sets the state to A (FIG. 4(b)); When the element is in state B, a signal that arrives on input line T' is merely transferred to output line $T_B$ without changing the state of the element (FIG. 4(c)). There is no signal allowed to arrive on input line T' when the element is in state A. Moreover, the simultaneous arrival of particles on any pair of input lines is not allowed. Obviously, the logic elements in FIGS. 3(a) and 3(b) are reversible and conservative.

According to another aspect of the first embodiment of the present invention, there is provided a reversible logic element having three input lines {T, T', S} from which a signal can be input, three output lines {$T_A$, $T_B$, S'} to which the signal can be output by output means, two states (an A-state and a B-state) controllable by state control means, the reversible logic element comprising: input information identification means for identifying which of the three input lines the signal is input from; state determination means capable of determining whether the reversible logic element is in the A-state or the B-state; and control means, wherein if the state determination means determines that the reversible logic element is in the A-state and the signal is input from the input line T, then the state determination means conveys information that the reversible logic element is in the A-state to the control means, the input information identification means conveys information that the signal is input from the input line T to the control means, and the control means controls the output means to output the signal to the output line $T_A$ and controls the state control means to change the state of the reversible logic element to the B-state, if the state determinations means determines that the reversible logic element is in the B-state and the signal is input from the input line T, then the state determination means conveys information that the reversible logic element is in the B-state to the control means, the input information identification means conveys the information that the signal is input from the input line T to the control means, and the control means controls the output means to output the signal to the output line $T_B$ and controls the state control means to change the state of the reversible logic element to the A-state, if the state determinations means determines that the reversible logic element is in the A-state and the signal is input from the input line S, then the state determination means conveys the information that the reversible logic element is in the A-state to the control means, the input information identification means conveys information that the signal is input from the input line S to the control means, and the control means controls the output means to output the signal to the output line S' while keeping the reversible logic element in the A-state, if the state determinations means determines that the reversible logic element is in the B-state and the signal is input from the input line S, then the state determination means conveys the information that the reversible logic element is in the B-state to the control means, the input information identification means conveys the information that the signal is input from the input line S to the control means, and the control means controls the output means to output the signal to the output line $T_A$ and controls the state control means to change the state of the reversible logic element to the A-state, and if the state determinations means determines that the reversible logic element is in the B-state and the signal is input from the input line T', then the state determination means conveys the information that the reversible logic element is in the B-state to the control means, the input information identification means conveys information that the signal is input from the input line T' to the control means, and the control means controls the output means to output the signal to the output line $T_B$ while keeping the reversible logic element in the B-state.

According to this embodiment, the control means selects, for example, table information to be selected based on the information conveyed from the state determination means, refers to tables shown in Tables 3 and 4 below, and transmits commands to the state control means and the output means, respectively, in accordance with the input line information conveyed from the input information identification means.

Table 3 represents the relationship between the input line information and the commands transmitted from the control means to the state control means and the output means, respectively, while the reversible logic element is in the A-state.

TABLE 3

| Input line | output means | state control means |
| --- | --- | --- |
| T | $T_A$ | B |
| S | S' | A |
| T' | S' | B |

Table 4 represents the relationship between the input line information and the commands transmitted from the control means to the state control means, the output means, respectively, while the reversible logic element is in the B-state.

TABLE 4

| Input line | output means | state control means |
| --- | --- | --- |
| T | $T_B$ | A |
| S | $T_A$ | A |
| T' | $T_B$ | B |

C-D Module

Figure 5A:
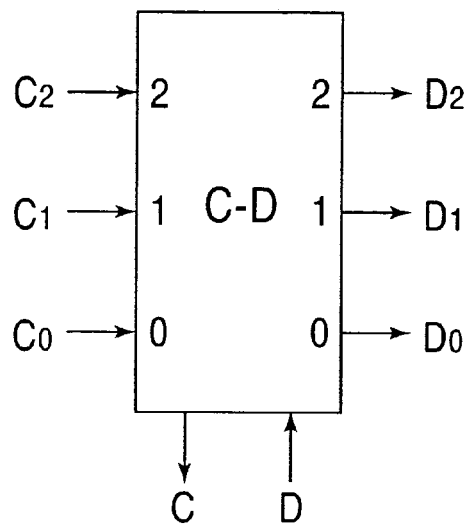
FIG. 5 (a) shows a C-D module itself.
Figure 5B:
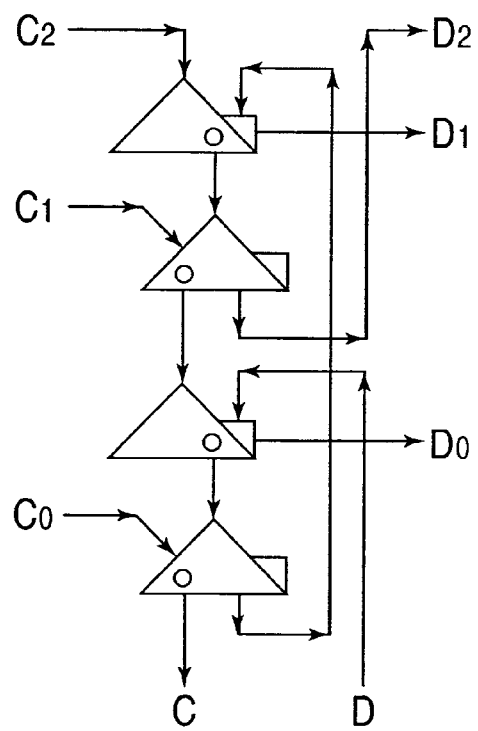

Before constructing an RE using the first reversible element, it is useful to construct an intermediate module. As is shown in FIG. 5(a) the module, Coding-Decoding (S-D) module, has four input lines $\{C_0, C_1, C_2, D\}$, four output lines $\{D_0, D_1, D_2, C\}$, and three states $\{0, 1, 2\}$ with 0 being the initial state. Signals (Particles) cannot arrive on input line $C_0$, $C_1$, or $C_2$ unless the C-D module is in state 0. A signal arriving on input line $C_i$ (i=$\{0, 1, $ or $2\}$) changes the state of the C-D module from 0 to i, and always resets the state to 0. A new input signal can only be input on an input line of the module if the previous input signal has been processed and it results in an output signal on an appropriate output line. It is not allowed to have signals on more than one input line simultaneously. Realization of the C-D module using the first reversible element is given in FIG. 5 (b), the validity of which can be easily verified.

Figure 6:
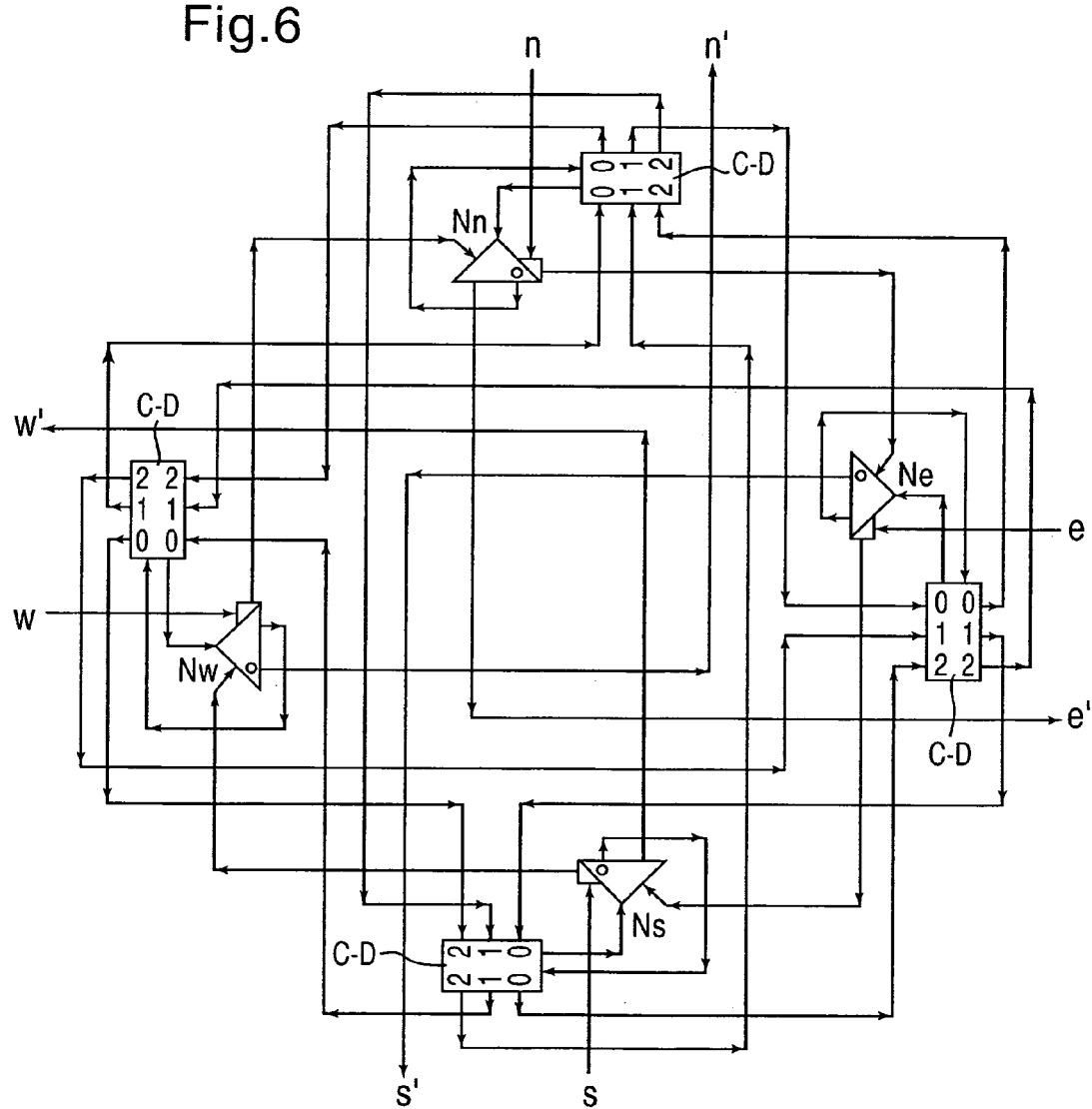
FIG. 6 shows a realization of an RE using the six-line reversible elements. All C-D modules in the circuit are in state 0 at the initial time. This RE is in state V.

FIG. 6 shows the detailed realization of an RE using the first reversible element of the present invention, in which the four elements $N_s$, $N_e$, $N_n$, and $N_w$ in states A, B, A, and B respectively represent the RE being in state V, whereas $N_s$, $N_e$, $N_n$, and $N_w$ in states B, A, B and A respectively represent the RE being in state H. This result shows that we can implement a circuit of the first reversible element to simulate any arbitrary reversible Turing machine, in which the reversible element is logically universal, and that can work in asynchronous mode without its operation having to be driven by a central clock signal.

Four-Line Reversible Elements

Figure 7A:
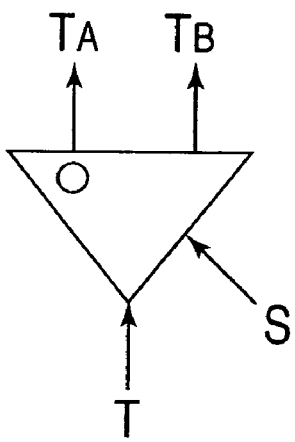
FIG. 7 (a) shows an RT element in an A-state.
Figure 7B:
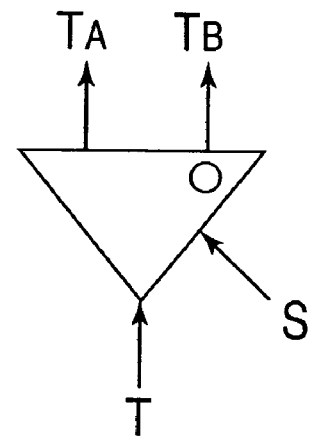
Figure 8A:
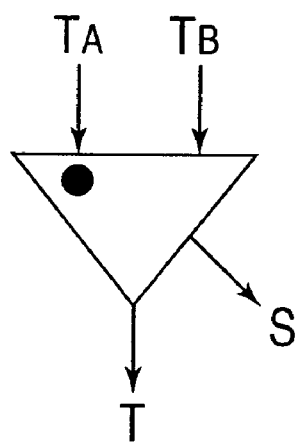
FIG. 8 (a) shows an IRT element in an A-state.
Figure 8B:
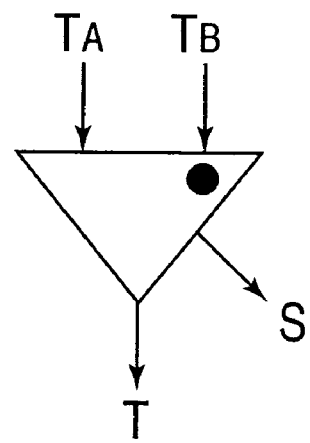

Here we present a second reversible element group for a second embodiment of the present invention. The second reversible element group has two kinds of reversible elements that have inverse functionalities. One element of the second reversible element group is called a Reading Toggle (RT). A RT has two input lines $\{S, T\}$, two output lines $\{T_A, T_B\}$, and two states $\{A, B\}$ (see FIGS. 7(a) and 7(b)). The other reversible element is called Inverse Reading Toggle (IRT). An IRT also has two input lines $\{T_A, T_B\}$, two output lines $\{S, T\}$, and two states $\{A, B\}$ (see FIGS. 8(a) and 8(b)).

Reversible logic elements according to the second embodiment of the present invention includes, for example, a first reversible logic element having two input lines $\{S, T\}$ from which a signal can be input, two output lines $\{T_A, T_B\}$ to which the signal can be output by output means, two states (an A-state and a B-state) controllable by state control means, the first reversible logic element comprising: input information identification means for identifying which of the two input lines the signal is input from; state determination means capable of determining whether the first reversible logic element is in the A-state or the B-state; and control means, wherein if the state determination means determines that the first reversible logic element is in the A-state and the signal is input from the input line T, then the state determination means conveys information that the first reversible logic element is in the A-state to the control means, the input information identification means conveys information that the signal is input from the input line T to the control means, and the control means controls the output means to output the signal to the output line $T_A$ and controls the state control means to change the state of the first reversible logic element to the B-state, if the state determinations means determines that the first reversible logic element is in the B-state and the signal is input from the input line T, then the state determination means conveys information that the first reversible logic element is in the B-state to the control means, the input information identification means conveys the information that the signal is input from the input line T to the control means, and the control means controls the output means to output the signal to the output line $T_B$ and controls the state control means to change the state of the first reversible logic element to the A-state, if the state determinations means determines that the first reversible logic element is in the A-state and the signal is input from the input line S, then the state determination means conveys the information that the first reversible logic element is in the A-state to the control means, the input information identification means conveys information that the signal is input from the input line S to the control means, and the control means controls the output means to output the signal to the output line $T_A$ and controls the state control means to keep the state of the first reversible element in the A-state, and if the state determinations means determines that the first reversible logic element is in the B-state and the signal is input from the input line S, then the state determination means conveys the information that the first reversible logic element is in the B-state to the control means, the input information identification means conveys the information that the signal is input from the input line S to the control means, and the control means controls the output means to output the signal to the output line $T_B$ and controls the state control means to keep the first reversible logic element in the B-state. This first reversible logic element functions as the RT described in this specification.

The control means included in the first reversible logic element according to the second embodiment selects, for example, table information to be selected based on the information conveyed from the state determination means, refers to tables shown in Tables 5 and 6 below, and transmits commands to the state control means and the output means, respectively, in accordance with the input line information conveyed from the input information identification means.

Table 5 represents the relationship between the input line information and the commands transmitted from the control means to the state control means and the output means, respectively, while the first reversible logic element is in the A-state.

TABLE 5

| Input line | output means | state control means |
|---|---|---|
| T | $T_A$ | B |
| S | $T_A$ | A |

Table 6 represents the relationship between the input line information and the commands transmitted from the control means to the state control means and the output means, respectively, while the first reversible logic element is in the B-state.

TABLE 6

| Input line | output means | state control means |
|---|---|---|
| T | $T_B$ | A |
| S | $T_B$ | B |

Further, the reversible logic elements according to the second embodiment of the present invention includes, for example, a second reversible logic element having two input lines $\{T_A, T_B\}$ from which a signal can be input, two output lines $\{S, T\}$ to which the signal can be output by output means, two states (an A-state and a B-state) controllable by state control means, the second reversible logic element comprising: input information identification means for identifying which of the two input lines the signal is input from; state determination means capable of determining whether the second reversible logic element is in the A-state or the B-state; and control means, wherein if the state determination means determines that the second reversible logic element is in the B-state and the signal is input from the input line $T_A$, then the state determination means conveys information that the second reversible logic element is in the B-state to the control means, the input information identification means conveys information that the signal is input from the input line $T_A$ to the control means, and the control means controls the output means to output the signal to the output line T and controls the state control means to change the state of the second reversible logic element to the A-state, if the state determinations means determines that the second reversible logic element is in the A-state and the signal is input from the input line $T_B$, then the state determination means conveys information that the second reversible logic element is in the A-state to the control means, the input information identification means conveys information that the signal is input from the input line $T_B$ to the control means, and the control means controls the output means to output the signal to the output line T and controls the state control means to change the state of the second reversible logic element to the B-state, if the state determinations means determines that the second reversible logic element is in the A-state and the signal is input from the input line $T_A$, then the state determination means conveys the information that the second reversible logic element is in the A-state to the control means, the input information identification means conveys the information that the signal is input from the input line $T_A$ to the control means, and the control means controls the output means to output the signal to the output line S and controls the state control means to keep the state of the second reversible element in the A-state, and if the state determinations means determines that the second reversible logic element is in the B-state and the signal is input from the input line $T_B$, then the state determination means conveys the information that the second reversible logic element is in the B-state to the control means, the input information identification means conveys the information that the signal is input from the input line $T_B$ to the control means, and the control means controls the output means to output the signal to the output line S and controls the state control means to keep the second reversible logic element in the B-state. This second reversible logic element functions as, for example, the IRT described in this embodiment.

According to this embodiment, the control means included in the second reversible logic element selects, for example, table information to be selected based on the information conveyed from the state determination means, refers to tables shown in Tables 7 and 8 below, and transmits commands to the state control means and the output means, respectively, in accordance with the input line information conveyed from the input information identification means.

Table 7 represents the relationship between the input line information and the commands transmitted from the control means to the state control means and the output means, respectively, while the second reversible logic element is in the A-state.

TABLE 7

| Input means | output means | state control means |
|---|---|---|
| $T_B$ | T | B |
| $T_A$ | S | A |

Table 8 represents the relationship between the input line information and the commands transmitted from the control means to the state control means and the output means, respectively, while the second reversible logic element is in the B-state.

TABLE 8

| Input means | output means | state control means |
|---|---|---|
| $T_B$ | S | B |
| $T_A$ | T | A |

Figure 9A:
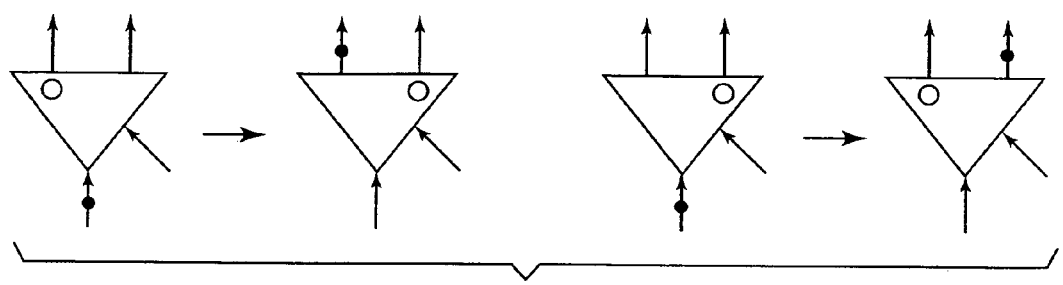
FIG. 9 (a) shows RTs operating on a signal arriving on input line T.
Figure 9B:
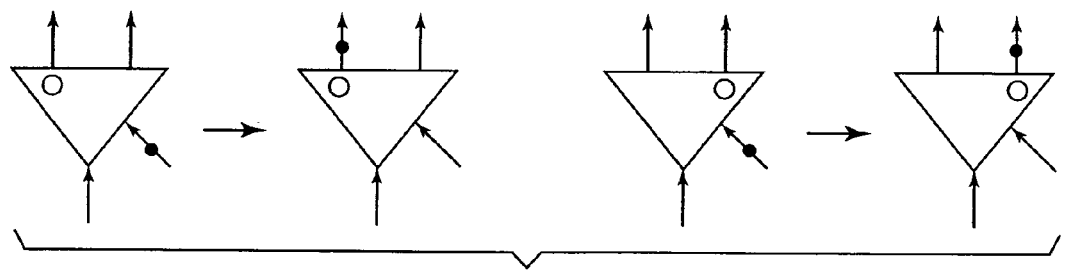

If no signal arrives on any of their input lines, both the RT and the IRT remain quiescent. When a signal arrives on an input line of RT, the RT operates on the signal as follows: As is shown in FIG. 9(a), a signal arriving on input line T is transferred to output line $T_A(T_B)$ if the RT s in state A(B), and changes the state to B(A). As is shown in FIG. 9(b), a signal arriving on input line S is merely transferred to output line $T_A(T_B)$ if the RT s in state A(B), without updating the state.

Figure 10A:
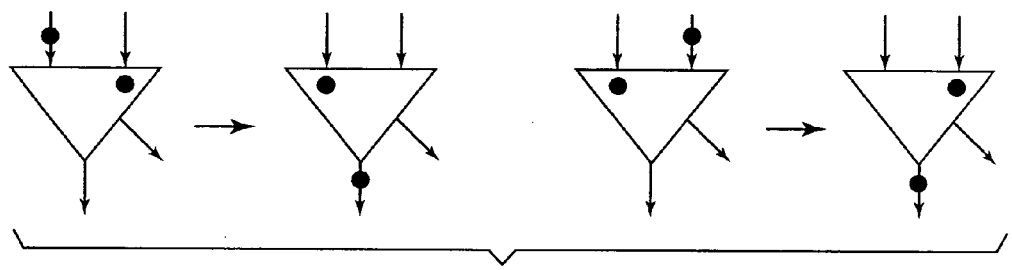
FIG. 10 (a) and FIG. 10 (b) show IRTs operating on a signal on one of its input lines.
Figure 10B:
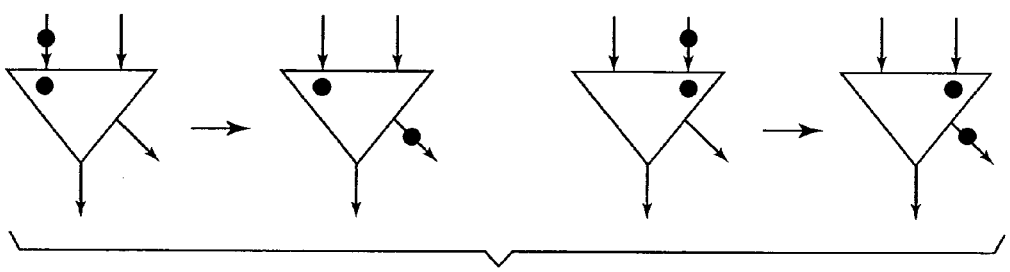

The IRT operates on an arrival on one of its input lines in the following way. As is shown in FIG. 10(a), a signal that arrives on input line $T_A(T_B)$ when the IRT is in state B(A) is transferred to output line T, and changes the state to A(B). As is shown in FIG. 10(b), a signal that arrives on input line $T_A(T_B)$ when the IRT is in state A(B) is merely transferred to output line S without updating of the state. Simultaneous signals on any input lines of RT or IRT are not allowed. Obviously, both the RT and the IRT are reversible, and logically inverse to each other.

Figure 11:
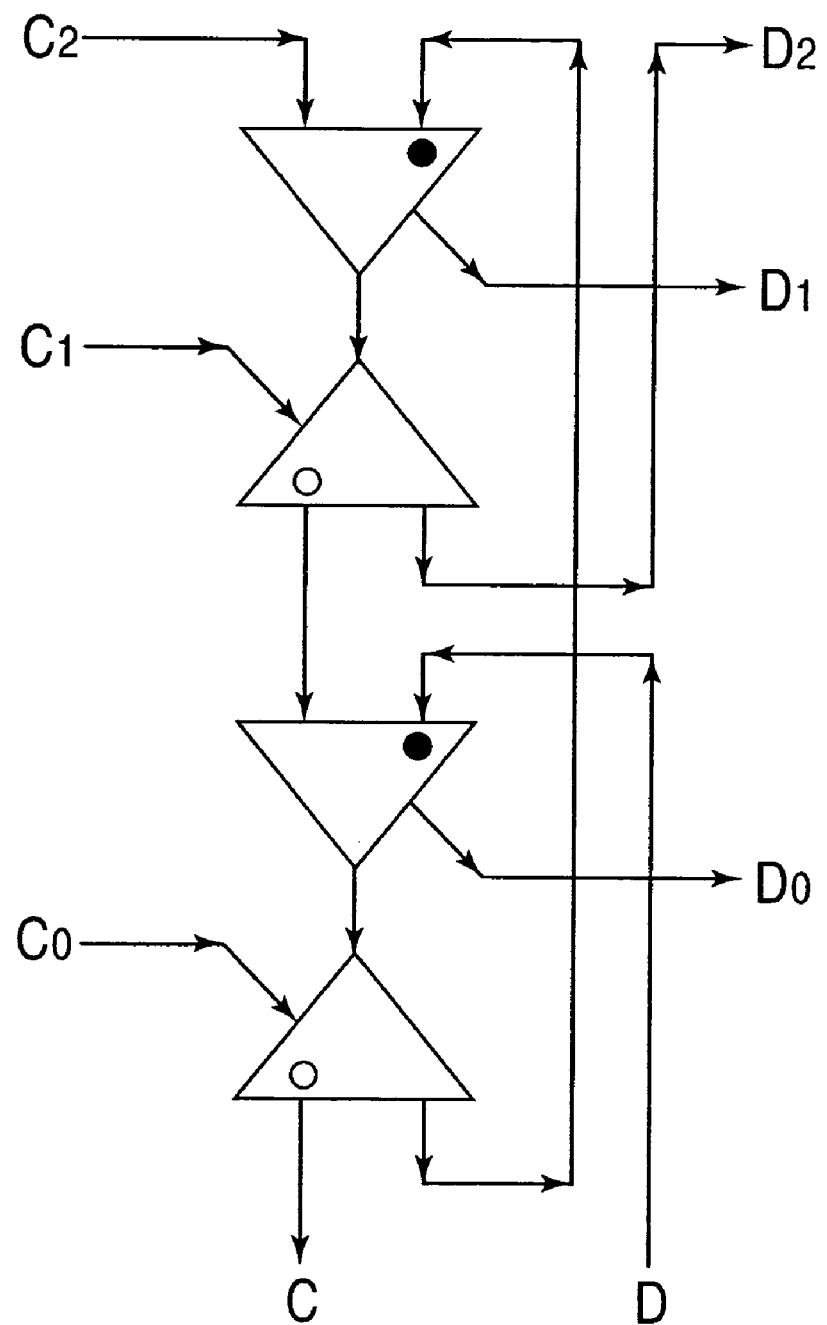
FIG. 11 shows a realization of a C-D module using RTs and IRTs.

FIG. 11 gives a realization, using RTs and IRTs, of the C-D module from FIG. 5(a), whose validity can be easily verified.

Figure 12:
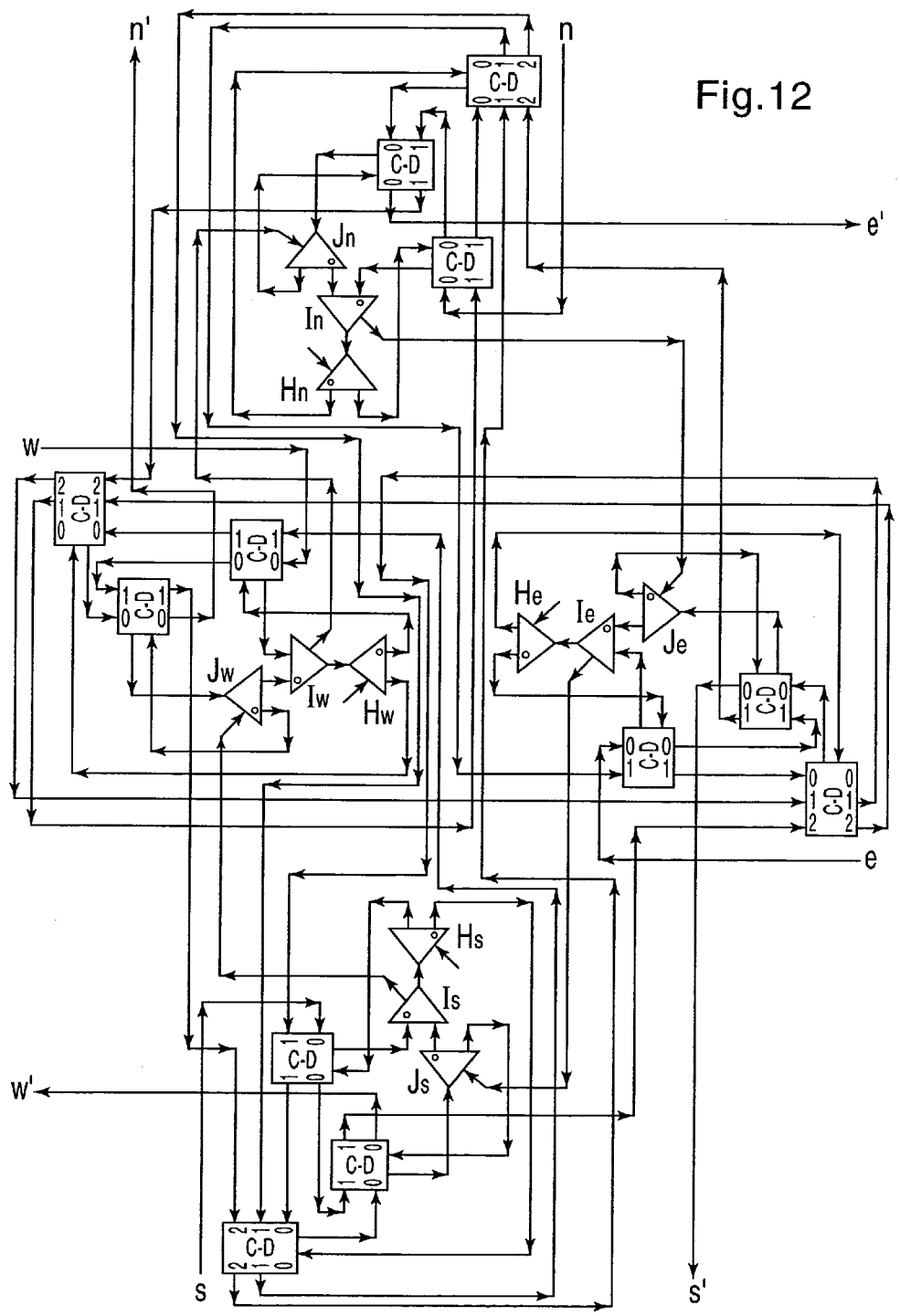
FIG. 12 shows a realization of an RE using RTs and IRTs, in which all C-D modules are in state 0 at the initial time. This RE is in state V. Positions of the input and output lines of this RE differ from those in FIG. 1.

FIG. 12 shows in detail a realization of an RE using RTs and IRTs, in which the four blocks of the RT and IRT elements $(H_s, I_s, J_s)$, $(H_e, I_e, J_e)$, $(H_e, I_n, J_n)$, and $(H_w, I_w, J_w)$, in states {B, B, A}, {A, A, B}, {B, B, A}, and {A, A, B} respectively represent the RE being in state V, whereas $(H_s, I_s, J_s)$, $(H_e, I_e, J_e)$, $(H_n, I_n, J_n)$, and $(H_w, I_w, J_w)$ in states {A, A, B}, {A, A, B}, {A, A, B}, and {A, A, B} respectively represent the RE being in state H. This result suffices to prove the logic universality of the RT and IRT elements, and that they can operate in asynchronous mode to enable the construction of universal reversible computers.

By using an element or the like that realizes the means included in the element as each of the reversible logic element according to the first embodiment and the reversible elements according to the second embodiment, any of these reversible logic elements can be employed as hardware of a chip or the like. In addition, by using these reversible logic elements, it is possible to construct a reversible logic circuit or a reversible computer having superior efficiency to that of the conventional (synchronous) reversible logic circuit or reversible computer. The reversible logic circuit or the reversible logic computer can estimate an input uniquely from an output result. From the viewpoint of thermodynamics, if the logic circuit or the computer is reversible, it is possible to suppress the dissipation of energy necessary for computing.

INDUSTRIAL APPLICABILITY

In this specification, we have introduced three novel reversible logic elements, i.e., the six-line reversible logic element having three input lines, three output lines, and two states, and the two four-line reversible logic elements (RT and IRT) each of which has two input lines, two output lines, and two states, and which are functionally inverse to each other. Each of these reversible logic elements is simpler than the RE, and the functionality of the RE is realized by a circuit constructed only from the six-line reversible logic elements or a circuit constructed from the RT and the IRT. Thus, the universal reversible computers in which there is at most one signal in the circuit at any time, as proposed in the Literatures stated above, can be constructed by a combination of the six-line reversible logic elements, the RT, and the IRT according to the present invention. It is thereby possible for the reversible logic elements according to the present invention to conduct computational tasks asynchronously without the need of a central clock signal. The reversible logic elements of the first embodiment and the second embodiment claimed here may also be used, possibly in combination with other logic elements, to construct reversible asynchronous computers in which there is more than one signal in a circuit at a time. Finally, two types of the reversible logic elements (RT and IRT) each having four input and output lines are used according to the present invention. Since the RT and the IRT have functionalities inverse to each other, it is possible to easily realize one of them from the other by hardware.

What is claimed is:

1. A reversible logic element comprising:
three input lines {T, T', S} from which a signal can be input;
three output lines {$T_A$, $T_B$, S'} to which the signal can be output by output means;
state control means for controlling two states (an A-state and a B-state);
input information identification means for identifying which of the three input lines the signal is input from;
state determination means for determining whether the reversible logic element is in the A-state or the B-state; and
control means, wherein
if said state determination means determines that said reversible logic element is in the A-state and the signal is input from the input line T, then said state determination means conveys information that said reversible logic element is in the A-state to said control means, said input information identification means conveys information that the signal is input from the input line T to said control means, and said control means controls said output means to output the signal to the output line $T_A$ and controls the state control means to change the state of the reversible logic element to the B-state,
if said state determinations means determines that said reversible logic element is in the B-state and the signal is input from the input line T, then said state determination means conveys information that said reversible logic element is in the B-state to said control means, said input information identification means conveys the information that the signal is input from the input line T to said control means, and said control means controls said output means to output the signal to the output line $T_B$ and controls said state control means to change the state of the reversible logic element to the A-state, if said state determinations means determines that said reversible logic element is in the A-state and the signal is input from the input line S, then said state determination means conveys the information that said reversible logic element is in the A-state to said control means, said input information identification means conveys information that the signal is input from the input line S to said control means, and said control means controls said output means to output the signal to the output line S' while keeping said reversible logic element in the A-state, if said state determinations means determines that said reversible logic element is in the B-state and the signal is input from the input line S, then said state determination means conveys the information that said reversible logic element is in the B-state to said control means, said input information identification means conveys the information that the signal is input from the input line S to said control means, and said control means controls said output means to output the signal to the output line $T_A$ and controls said state control means to change the state of said reversible logic element to the A-state, and if said state determinations means determines that said reversible logic element is in the B-state and the signal is input from the input line T', then said state determination means conveys the information that said reversible logic element is in the B-state to said control means, said input information identification means conveys information that the signal is input from the input line T' to said control means, and said control means controls said output means to output the signal to the output line $T_B$ while keeping said reversible logic element in the B-state.

2. The reversible logic element according to claim 1, wherein said signal is an electric signal.

3. A method for constructing a logic circuit using the reversible logic element according to claim 1.

4. A method for constructing a computer using the reversible logic element according to claim 1.

5. A program for allowing a computer to function as the reversible logic element according to claim 1.

6. A recording medium recording the program according to claim 5.

7. A reversible logic element having three input lines {T, T', S} from which a signal can be input, three output lines {$T_A$, $T_B$, S'} to which the signal can be output by output means, two states (an A-state and a B-state) controllable by state control means, the reversible logic element comprising:
  input information identification means for identifying which of the three input lines the signal is input from;
  state determination means capable of determining whether the reversible logic element is in the A-state or the B-state; and
  control means, wherein
  if said state determination means determines that said reversible logic element is in the A-state and the signal is input from the input line T, then said state determination means conveys information that said reversible logic element is in the A-state to the control means, said input information identification means conveys information that the signal is input from the input line T to said control means, and said control means controls said output means to output the signal to the output line $T_A$ and controls said state control means to change the state of the reversible logic element to the B-state, if said state determinations means determines that said reversible logic element is in the B-state and the signal is input from the input line T, then said state determination means conveys information that said reversible logic element is in the B-state to said control means, said input information identification means conveys the information that the signal is input from the input line T to said control means, and said control means controls the output means to output the signal to the output line $T_B$ and controls the state control means to change the state of the reversible logic element to the A-state, if said state determinations means determines that said reversible logic element is in the A-state and the signal is input from the input line S, then said state determination means conveys the information that said reversible logic element is in the A-state to said control means, said input information identification means conveys information that the signal is input from the input line S to said control means, and said control means controls the output means to output the signal to the output line S' while keeping said reversible logic element in the A-state, if said state determinations means determines that said reversible logic element is in the B-state and the signal is input from the input line S, then said state determination means conveys the information that said reversible logic element is in the B-state to said control means, said input information identification means conveys the information that the signal is input from the input line S to said control means, and said control means controls said output means to output the signal to the output line $T_A$ and controls said state control means to change the state of said reversible logic element to the A-state, if said state determinations means determines that said reversible logic element is in the A-state and the signal is input from the input line T', then said state determination means conveys the information that said reversible logic element is in the A-state to said control means, said input information identification means conveys information that the signal is input from the input line T' to said control means, and said control means controls said output means to output the signal to the output line S' and controls said state control means to change the state of said reversible logic element to the B-state; and if said state determinations means determines that said reversible logic element is in the B-state and the signal is input from the input line T', then said state determination means conveys the information that said reversible logic element is in the B-state to said control means, said input information identification means conveys information that the signal is input from the input line T' to said control means, and said control means controls said output means to output the signal to the output line $T_B$ while keeping said reversible logic element in the B-state.

8. The reversible logic element according to claim 7, wherein said signal is an electric signal.

9. A method for constructing a logic circuit using the reversible logic element according to claim 7.

10. A method for constructing a computer using the reversible logic element according to claim 7.

11. A program for allowing a computer to function as the reversible logic element according to claim 7.

12. A recording medium recording the program according to claim 11.

13. A reversible logic element group comprising: a first reversible logic element; and a second reversible logic element, wherein the first reversible logic element has two input lines {S, T} from which a signal can be input, two output lines {$T_A$, $T_B$} to which the signal can be output by output means, two states (an A-state and a B-state) controllable by state control means, the first reversible logic element comprising: input information identification means for identifying which of the two input lines the signal is input from; state determination means capable of determining whether the first reversible logic element is in the A-state or the B-state; and control means, and if said state determination means determines that said first reversible logic element is in the A-state and the signal is input from the input line T, then said state determination means conveys information that said first reversible logic element is in the A-state to said control means, said input information identification means conveys information that the signal is input from the input line T to said control means, and said control means controls the output means to output the signal to said output line $T_A$ and controls said state control means to change the state of said first reversible logic element to the B-state, if said state determinations means determines that said first reversible logic element is in the B-state and the signal is input from the input line T, then said state determination means conveys information that said first reversible logic element is in the B-state to said control means, said input information identification means conveys the information that the signal is input from the input line T to said control means, and said control means controls said output means to output the signal to the output line $T_B$ and controls said state control means to change the state of said first reversible logic element to the A-state, if said state determinations means determines that said first reversible logic element is in the A-state and the signal is input from the input line S, then said state determination means conveys the information that said first reversible logic element is in the A-state to said control means, said input information identification means conveys information that the signal is input from the input line S to said control means, and said control means controls said output means to output the signal to the output line $T_A$ and controls said state control means to keep the state of said first reversible element in the A-state, and if said state determinations means determines that said first reversible logic element is in the B-state and the signal is input from the input line S, then said state determination means conveys the information that said first reversible logic element is in the B-state to said control means, said input information identification means conveys the information that the signal is input from the input line S to said control means, and said control means controls said output means to output the signal to the output line $T_B$ and controls said state control means to keep said first reversible logic element in the B-state; and wherein a second reversible logic element has two input lines {$T_A$, $T_B$} from which a signal can be input, two output lines {S, T} to which the signal can be output by output means, two states (an A-state and a B-state) controllable by state control means, the second reversible logic element comprising: input information identification means for identifying which of the two input lines the signal is input from; state determination means capable of determining whether the second reversible logic element is in the A-state or the B-state; and control means, wherein if said state determination means determines that said second reversible logic element is in the B-state and the signal is input from the input line $T_A$, then said state determination means conveys information that said second reversible logic element is in the B-state to the control means, said input information identification means conveys information that the signal is input from the input line $T_A$ to said control means, and said control means controls said output means to output the signal to the output line T and controls said state control means to change the state of said second reversible logic element to the A-state, if said state determinations means determines that said second reversible logic element is in the A-state and the signal is input from the input line $T_B$, then said state determination means conveys information that said second reversible logic element is in the A-state to said control means, said input information identification means conveys information that the signal is input from the input line $T_B$ to said control means, and said control means controls said output means to output the signal to the output line T and controls said state control means to change the state of said second reversible logic element to the B-state, if said state determinations means determines that said second reversible logic element is in the A-state and the signal is input from the input line $T_A$, then said state determination means conveys the information that said second reversible logic element is in the A-state to said control means, said input information identification means conveys the information that the signal is input from the input line $T_A$ to said control means, and said control means controls the output means to output the signal to the output line S and controls said state control means to keep the state of said second reversible element in the A-state, and if said state determinations means determines that said second reversible logic element is in the B-state and the signal is input from the input line $T_B$, then said state determination means conveys the information that said second reversible logic element is in the B-state to said control means, said input information identification means conveys the information that the signal is input from the input line $T_B$ to said control means, and said control means controls said output means to output the signal to the output line S and controls said state control means to keep said second reversible logic element in the B-state.

14. The reversible logic element group according to claim 13, wherein said signal is an electric signal.

15. A method for constructing a logic circuit using the reversible logic element group according to claim 13.

16. A method for constructing a computer using the reversible logic element group according to claim 13.

17. A program for allowing a computer to function as the first reversible logic element and the second reversible logic element according to claim 13.

18. A recording medium recording the program according to claim 17.

* * * * *